(12) United States Patent
Cai et al.

(10) Patent No.: US 9,653,176 B2
(45) Date of Patent: May 16, 2017

(54) READ DISTURB RECLAIM POLICY

(71) Applicant: SK Hynix Memory Solutions Inc., San Jose, CA (US)

(72) Inventors: Yu Cai, San Jose, CA (US); Fan Zhang, Fremont, CA (US); Haibo Li, Sunnyvale, CA (US); June Lee, Sunnyvale, CA (US)

(73) Assignee: SK Hynix Memory Solutions Inc., San Jose, CA (US)

( * ) Notice: Subject to any disclaimer, the term of this patent is extended or adjusted under 35 U.S.C. 154(b) by 0 days.

(21) Appl. No.: 15/184,878

(22) Filed: Jun. 16, 2016

(65) Prior Publication Data

US 2016/0372208 A1   Dec. 22, 2016

Related U.S. Application Data

(60) Provisional application No. 62/180,506, filed on Jun. 16, 2015.

(51) Int. Cl.

| G11C 16/34 | (2006.01) |
|---|---|
| G11C 16/26 | (2006.01) |
| G11C 29/42 | (2006.01) |
| G11C 29/44 | (2006.01) |
| G11C 16/04 | (2006.01) |
| G06F 11/07 | (2006.01) |
| G11C 16/08 | (2006.01) |
| G11C 7/02 | (2006.01) |
| G11C 29/52 | (2006.01) |

(52) U.S. Cl.
CPC ........ *G11C 16/3431* (2013.01); *G06F 11/076* (2013.01); *G06F 11/079* (2013.01); *G06F 11/0727* (2013.01); *G06F 11/0793* (2013.01); *G11C 7/02* (2013.01); *G11C 16/0483* (2013.01); *G11C 16/08* (2013.01); *G11C 16/26* (2013.01); *G11C 16/349* (2013.01); *G11C 29/42* (2013.01); *G11C 29/52* (2013.01); *G11C 16/3418* (2013.01); *G11C 16/3422* (2013.01); *G11C 16/3427* (2013.01)

(58) Field of Classification Search
CPC ............ G11C 16/3427; G11C 16/0483; G11C 16/3418; G11C 16/3431; G11C 16/3422; G11C 29/52; G11C 29/42
USPC ........................................ 365/185.02, 185.09
See application file for complete search history.

(56) References Cited

U.S. PATENT DOCUMENTS

| 7,808,831 B2 | 10/2010 | Mokhlesi et al. |
| 2015/0370701 A1* | 12/2015 | Higgins .............. G06F 12/0253 711/103 |

* cited by examiner

*Primary Examiner* — Ly D Pham
(74) *Attorney, Agent, or Firm* — IP & T Group LLP

(57) ABSTRACT

Memory systems may include a memory including a plurality of memory blocks and a controller. The controller calculates an effective read disturb based on both a direct neighbor read disturb count and a non-direct neighbor read disturb count. The controller selects a wordline with the largest effective read disturb for test read and deciding whether to reclaim the data of the block based on the errors on the wordline.

20 Claims, 8 Drawing Sheets

READ DISTURB RECLAIM POLICY

CROSS-REFERENCE TO RELATED APPLICATIONS

This application claims the benefit of U.S. Provisional Application No. 62/180,506 filed Jun. 16, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Aspects of the invention include memory systems. The memory systems may include a memory including a plurality of memory blocks, and a controller suitable for, calculating an effective read disturb by considering both direct neighbor read disturb count and non-direct neighbor read disturb count, selecting a wordline with the largest effective read disturb for test read, and deciding whether to reclaim the data of the block based on the errors on the wordline.

Further aspects of the invention include methods. The methods may include calculating an effective read disturb metric by considering both direct neighbor read disturb count and non-direct neighbor read disturb count, selecting a wordline with the largest effective read disturb for test read, and deciding whether to reclaim the data of the block based on the errors on the wordline.

Additional aspects of the invention include memory devices. The memory devices may include a memory including a plurality of memory blocks, a first counter, a second counter, and means for calculating an effective read disturb metric by considering both direct neighbor read disturb count and non-direct neighbor read disturb count, selecting a wordline with the largest effective read disturb for test read, and deciding whether to reclaim the data of the block based on the errors on the wordline.

DETAILED DESCRIPTION

Figure 1:
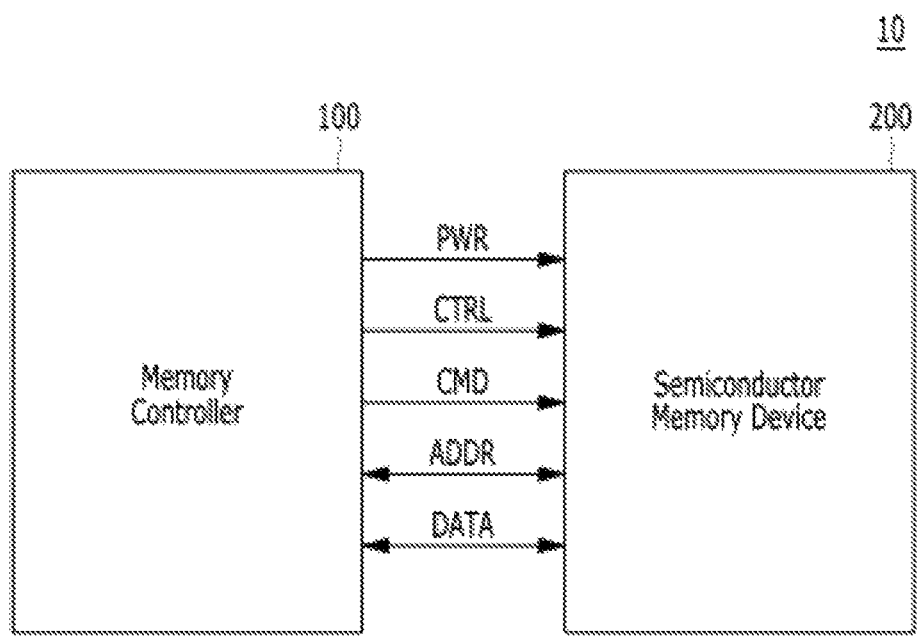
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
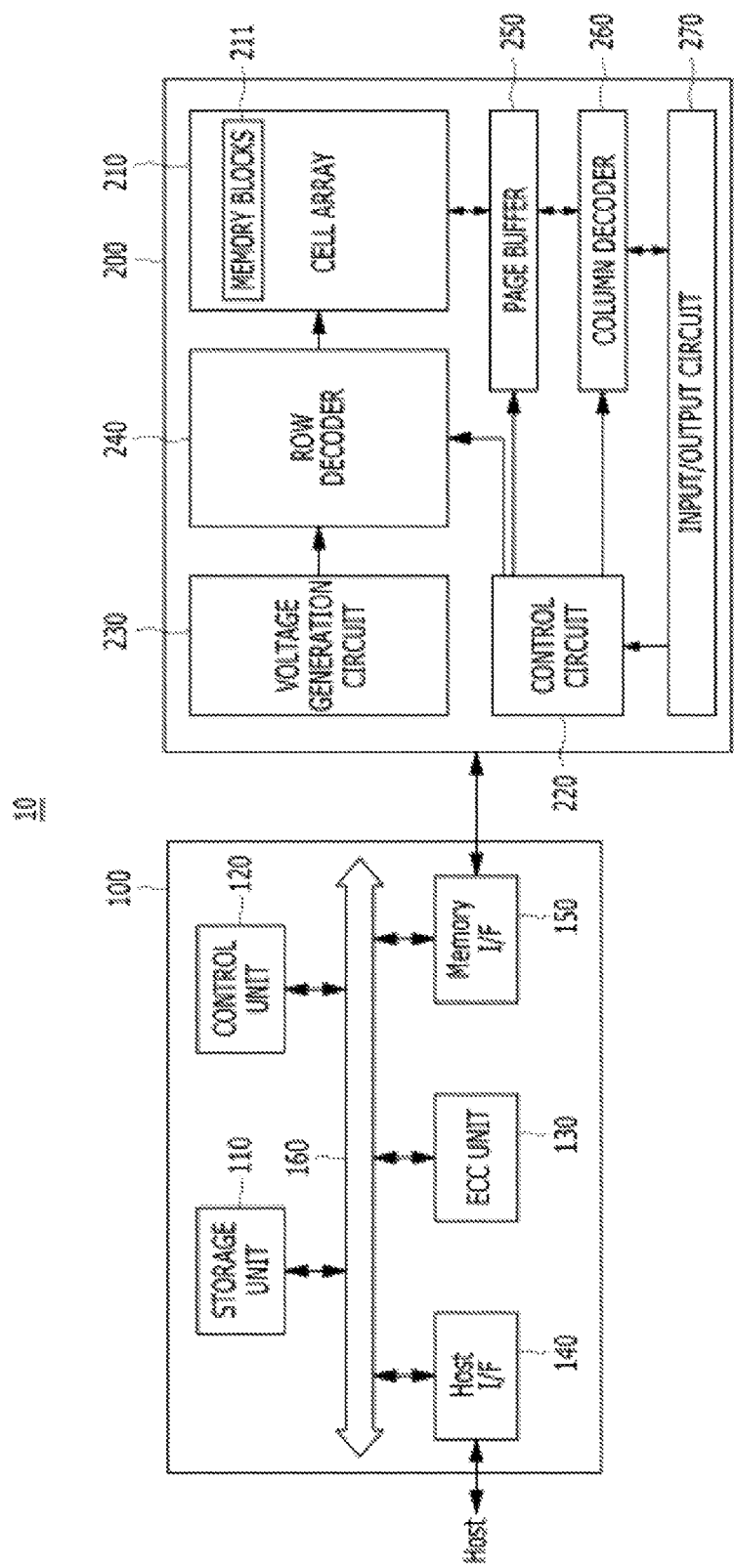
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device. The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
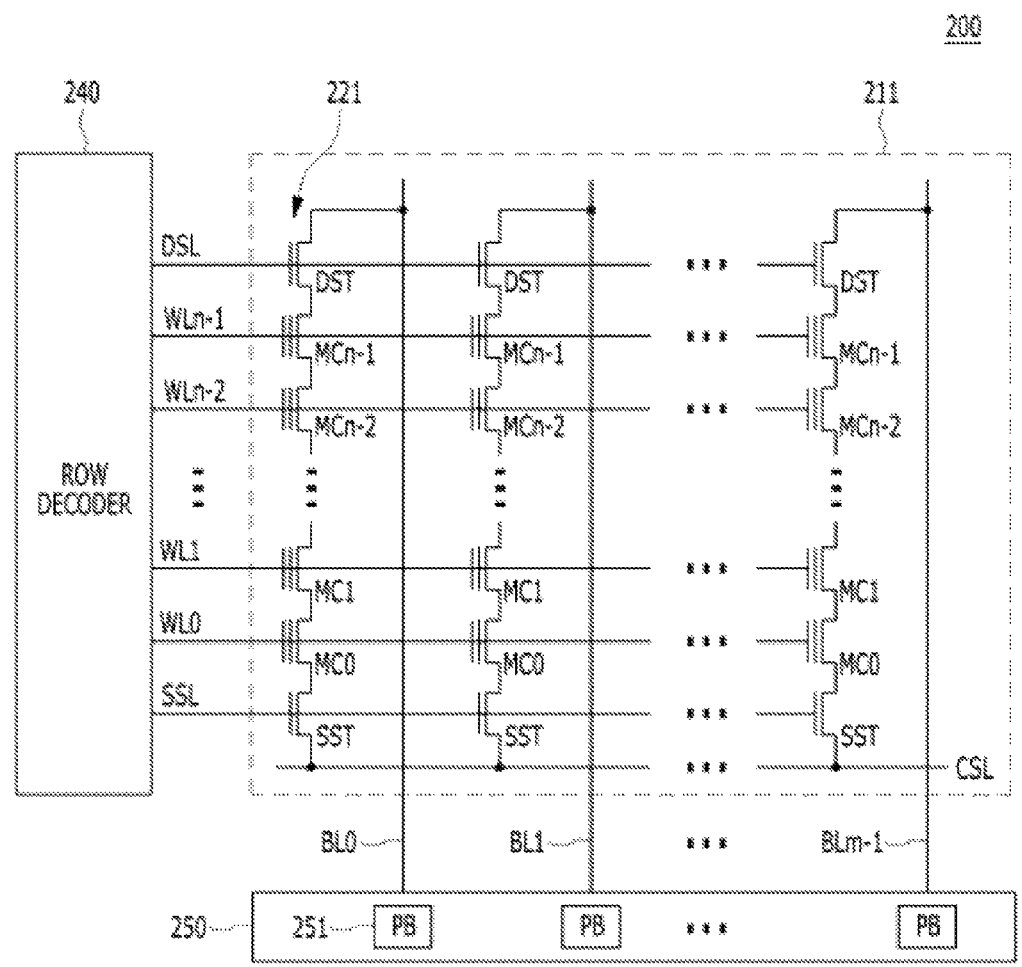
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Accumulated read disturb errors are one of the major sources of flash errors. When the cells on the wordline are read, the cells on the other wordlines in the same block will be disturbed by the relative high $V_{pass}$ voltage applied during read operation. Although one read operation has very small impact on wordlines, the accumulated reads over time can eventually introduce enough errors so that the total number of errors will be larger than the ECC error correction capability, causing uncorrectable errors and data loss.

The read disturb errors can be overcome by flash correct and refresh. The main ideas are to read data from flash memory before the flash media accumulates too many errors than ECC can correct, leverage the ECC engine in flash controller to correct these errors, and reprogram the error free data into flash memory. One key question is when to reclaim the data under read disturb before the errors become uncorrectable.

A problem with current solutions is that they assume that the read disturb on non-neighbor wordlines are negligible and only count the read disturb caused by direct neighbor wordlines. For example, when wordline n is read, the read disturb count of its direct neighbor, wordline (n−1) and wordline (n+1), are increased by one to count the number of read disturbs. The read disturb count of the other non-direct wordlines are not calculated. In a typical embodiment, once certain threshold, i.e. 10 k reads, the wordline with the largest read disturb in the block will be checked. If the error count is larger than a threshold, e.g., 70% of ECC error correction capability, the data in the block will be reclaimed.

Figure 7:
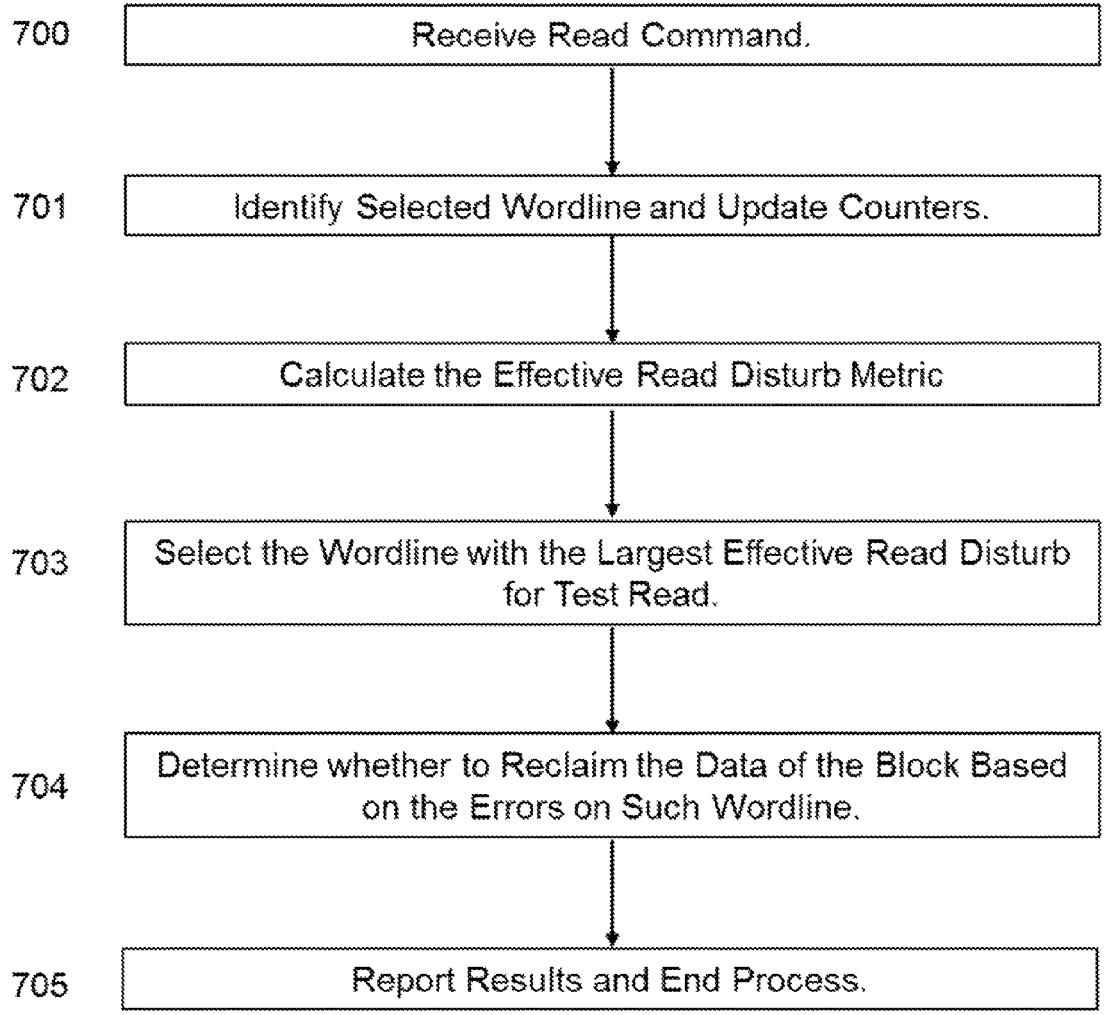
FIG. 7 is a flowchart of steps in a method according to aspects of the invention.

However, this may not be true for certain cases, which will be further examined with FIG. 7. When a wordline is read, its non-direct neighbor wordlines will also suffer from read disturbs.

Figure 4:
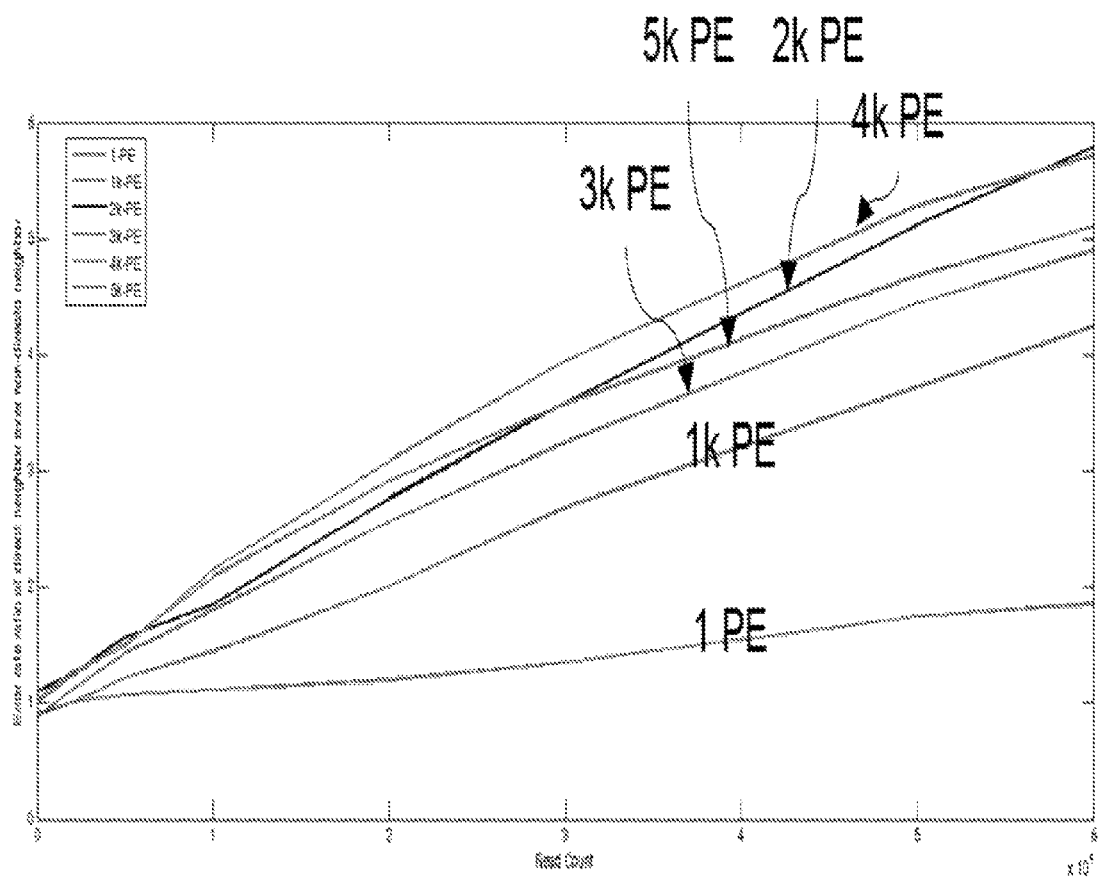
FIG. 4 is an example of a raw bit error rate ratio of direct neighbour wordline over non-direct neighbour wordline for different read disturbs at different P/E cycles.

FIG. 4 illustrates an example of a raw bit error rate ratio of direct neighbour wordline over non-direct neighbour wordline for different read disturbs at different P/E cycles.

Referring to FIG. 4, wordline n are repeatedly read and the raw bit error rate of wordline n−2, which is non-direct neighbor wordline, and n−1, which is a direct neighbor wordline are measured after certain number of reads on wordline n are executed. To better illustrate this, FIG. 4 shows the error rate ratio of the MSB page of direct neighbor wordline n−1 over MSB page of non-direct neighbor wordline n−2. The x-axis is the read disturb count, and the y-axis is the error ratio of direct neighbor over non-direct neighbor.

As the result of the experiments, the read disturb error rate of non-direct neighbor wordline is about half of the direct neighbor wordline. Due to this, ignoring the read disturb effect on non-direct neighbor wordline may not find the most disturbed wordline, if only direct neighbor disturb is considered. This may further lead to data loss when the read disturb error on such wordline is beyond the ECC error correction capability.

Figure 5:
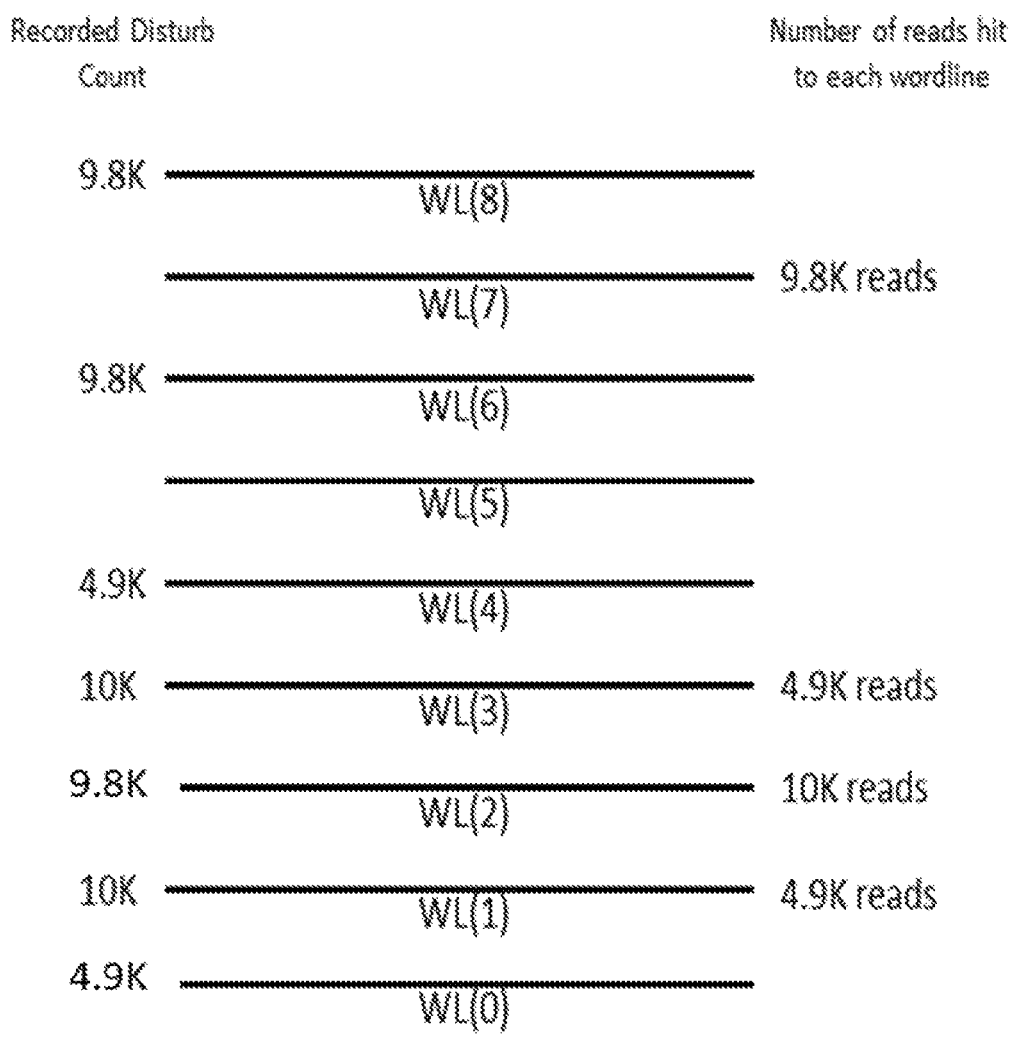
FIG. 5 is an example of reads to different wordlines and the recorded disturb count.

FIG. 5 illustrates an example of reads to different wordlines and the recorded disturb count.

Referring to FIG. 5, WL(1) and WL(3) are read for 4.9 k times. WL(2) is read 10 k times, and WL(7) is read 9.8 k times. Thus, WL(2) is the hottest wordline and is read by 10 k times, and WL(7) is the second hottest wordline and is read by 9.8 k times.

According to the conventional art, which only uses a direct neighbor disturb, WL(1) and WL(3) have been disturbed by direct disturb for 10 k times, respectively. WL(6) and WL(8) have been interfered by direct neighbor disturb for 9.8 k times, respectively. Thus, WL(1) and WL(3) are considered to be most disturbed under the conventional art.

As mentioned above, the conventional art does not take into account the non-direct neighbor wordline disturb. WL(6) and WL(8) are disturbed by 19.8 k (4.9 k+4.9 k+10 k=19.8 k) non-direct read disturb. WL(1) and WL(3) are disturbed by 14.7 k (4.9 k+9.8 k=14.7 k) non-direct read disturb. Therefore, according to this example, WL(6) and WL(8) suffer from 9.8 k direct read disturb and 19.8 k (4.9 k+4.9 k+10 k=19.8 k) non-direct read disturb. Thus, the total effective read disturb, if the direct disturb and non-direct disturb ratio is 2:1, is equal to 19.7 k (9.8 k+19.8 k*0.5). WL(1) and WL(3) suffer from 10 k direct read disturb and 14.7 k (4.9 k+9.8 k) non direct read disturb. Thus, the total effective read disturb, if the direct disturb and non-direct disturb ratio is 2:1, is equal to 17.35 k (10 k+14.7 k*0.5).

According to the conventional art, if we ignore non-direct neighbor read disturb, either WL(1) or WL(3) will be tested since these wordlines have the largest direct read disturb. However, in reality, if non-direct read disturb is considered, then WL(6) and WL(8) have more disturb errors. Thus, after the next 10 k reads when we test the read disturb errors of the block, the data stored on WL(6) or WL(8) may be unrecoverable and cause data loss, while WL(1) and WL(3) may still be correctable. In other words, using only direct neighbor count to find the wordline with most read disturb and making the read reclaim decision may cause the actual wordline with most read disturb to be missed.

Figure 6:
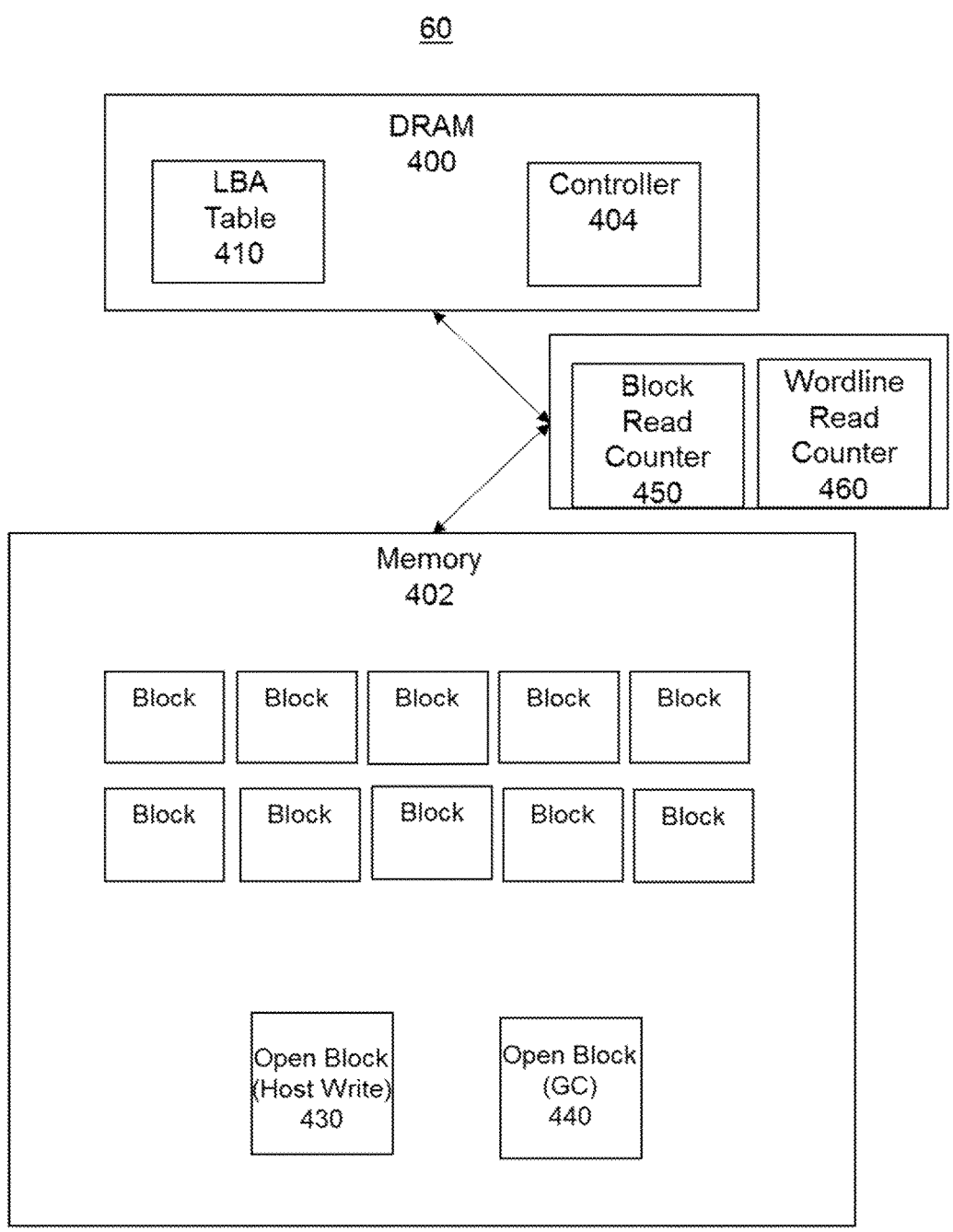
FIG. 6 is a diagram of an example system according to aspects of the invention.

Referring to FIG. 6, an example system 60 for addressing the above described problems is shown. The system 60 includes a volatile memory (DRAM) 400 and a memory 402. The DRAM 400 may include an LBA table 410 and a controller 404, such as the controllers described above. The memory 402 may include a plurality of blocks, an open block for host writes 430 and an open block for garbage collection 440. The system 60 also includes a block read counter 450 and a wordline read counter 460. The counters 450 and 460 may be housed on the memory 402 and/or the DRAM 400, or alternatively, on a separate storage.

Because the embodiments of the present invention utilizes relatively simple system, there is no major storage overhead increase associated with the embodiments of the present invention. For example, there is no increase in the total read count of each block or super block, i.e. group of blocks, and total read count of each wordline. In short, the embodiments have the same storage overhead as the conventional direct neighbor only solution, since read count per wordline need to be recorded as well.

FIG. 7 is a flowchart 70 of steps for determining a wordline with most read disturb by considering both direct neighbor read disturb and non-direct neighbor read disturb. The functionality of the steps and other processes disclosed herein may be operated by a controller such as the controller described above.

At step 700 and 701, a block read counter corresponding to a block is incremented when the block is read. The block read counter 450 and wordline read counter 460 increases after each read to its corresponding block. The neighbor wordline error rate will be checked when the counters reach a certain predefined count number. The predefined count number may be set to about 10,000 reads, or other values as is desirable according to the particular specifications of the systems.

At step 702, after the predetermined reads to a block, effective read disturb of each wordline is calculated based on the read count of the wordline's direct neighbors and non-direct neighbors. Different method to calculate the effective read disturb of each wordline is described below.

In an exemplary embodiment, alpha, which is a ratio of raw error number increase per one read disturb from non-direct neighbor wordline and the raw error number increase per one read disturb from direct neighbor wordline, may be a fixed ratio determined based on a flash pre-characterization. In an embodiment, after every predetermined number of reads (i.e. 10 k reads), the wordline that suffer the largest read disturb by considering both the direct neighbor and non-direct neighbor read disturbs is selected. According to FIG. 4, the ratio alpha may be estimated to be ½. In other words, it is possible to estimate such ratio to be 2 to favor direct neighbor disturb over non-direct neighbor disturb and use that characterization/ratio in determining a wordline with the most read disturb.

In another embodiment, adaptive ratio learning may be used to calculate alpha at the predetermined number of reads (i.e. 10 k reads) for the block. The error rate of the page on a wordline, for example, MSB page for 2-bit multi-level cell NAND, may be modeled as:

$$ERR(WL_i) = NumDirect(WL_i) \times X_1 + NumNonDirect(WL_i) \times X_2 + ERR_{Base} \quad \text{[Equation 1]}$$

According to the above embodiment, $ERR(WL_i)$ is the total errors on the i-th wordline. $ERR_{Base}$ is the number of errors when there is no read disturb immediately after program operation. $X_1$ represents the raw error number increase per one read disturb from direct neighbor wordline. $X_2$ represents the raw error number increase per one read disturb from non-direct neighbor wordline.

If we test three wordlines, i.e. WL(i), WL(j), and WL(k), and check the error difference between two wordlines, we can get the following estimated error rate difference equation:

$$\begin{pmatrix} ERR(WL_i) - ERR(WL_j) \\ ERR(WL_i) - ERR(WL_k) \end{pmatrix} = \qquad \text{[Equation 2]}$$

$$\begin{pmatrix} NumDirect(WL_i) - NumDirect(WL_j) & NumNonDirect(WL_i) - NumNonDirect(WL_j) \\ NumDirect(WL_i) - NumDirect(WL_k) & NumNonDirect(WL_i) - NumNonDirect(WL_k) \end{pmatrix} \times$$

$$\begin{pmatrix} X_1 \\ X_2 \end{pmatrix} \text{ which corresponds to general format of equation:}$$

$$\begin{pmatrix} A \\ B \end{pmatrix} = \begin{pmatrix} M_{11} & M_{12} \\ M_{21} & M_{22} \end{pmatrix} \times \begin{pmatrix} X_1 \\ X_2 \end{pmatrix} \qquad \text{[Equation 3]}$$

$M_{11}$, $M_{12}$, $M_{21}$, $M_{22}$ in the general equation are coefficients, which correspond to recorded read count of the wordlines in the block. In more detail, NumDirect(WLi) is the sum of the number of reads on the (i−1)th and (i+1)th wordline. If the wordline is the top or bottom wordline inside a block, only one direct neighbor wordline will be considered. NumNonDirect(WLi) may be calculated by the total number of reads hit to the block minus the number of reads hit to the wordline itself and the number of reads hit to the direct neighbor wordlines of the selected wordline. A, B in the general equation corresponds to the error difference between three wordlines (i.e. $WL_i$ and $WL_j$, $WL_i$ and $WL_k$), which may be obtained from the wordline error testing.

The average error increase per direct neighbor disturb, $X_1$, may be calculated as:

$$X_1 = \frac{\begin{array}{c}(ERR(WL_i) - ERR(WL_j)) \times \\ (NumNonDirect(WL_i) - NumNonDirect(WL_k)) - \\ (ERR(WL_i) - ERR(WL_k)) \times \\ (NumNonDirect(WL_i) - NumNonDirect(WL_j))\end{array}}{\begin{array}{c}(NumDirect(WL_i) - NumDirect(WL_j)) * \\ (NumNonDirect(WL_i) - NumNonDirect(WL_k)) - \\ (NumDirect(WL_i) - NumDirect(WL_k)) * \\ (NumNonDirect(WL_i) - NumNonDirect(WL_j))\end{array}} \quad \text{[Equation 4]}$$

The average error increase per non-direct neighbor disturb, $X_2$, may be calculated as:

$$X_2 = \frac{\begin{array}{c}(ERR(WL_i) - ERR(WL_j)) \times \\ (NumDirect(WL_i) - NumDirect(WL_k)) - \\ (ERR(WL_i) - ERR(WL_k)) \times \\ (NumDirect(WL_i) - NumDirect(WL_j))\end{array}}{\begin{array}{c}(NumNonDirect(WL_i) - NumNonDirect(WL_j)) * \\ (NumDirect(WL_i) - NumDirect(WL_k)) - \\ (NumDirect(WL_i) - NumDirect(WL_j)) * \\ (NumNonDirect(WL_i) - NumNonDirect(WL_j))\end{array}} \quad \text{[Equation 5]}$$

The ratio, alpha, in a pseudo code may be calculated by $X_2/X_1$, if the adaptive ratio learning is used in an embodiment.

At step 703, by utilizing either the fixed ration solution based on flash pre-characterization or adaptive ratio learning, the wordline with the largest effective read disturb may be calculated. According to step 702, the effective read disturb of each wordline may be calculated.

At step 704 and 705, it is determined whether to reclaim the data of the block based on the errors on such wordline. For example, if the flash memory is two-bit multi-level cell NAND flash memory, it is possible to test the errors in the MSB page of such wordline. If the total number of errors is larger than 70% of ECC correction capability, such block may be reclaimed. If not, the process is waited until next predetermined number of reads (i.e. 10 k reads) is reached for the block and test the wordline with the largest effective read disturb again at that time. Please note that 70% ECC capability is just an exemplary embodiment and it is possible to use any other number that is determined by ECC correction capability and NAND flash characteristics.

Figure 8:
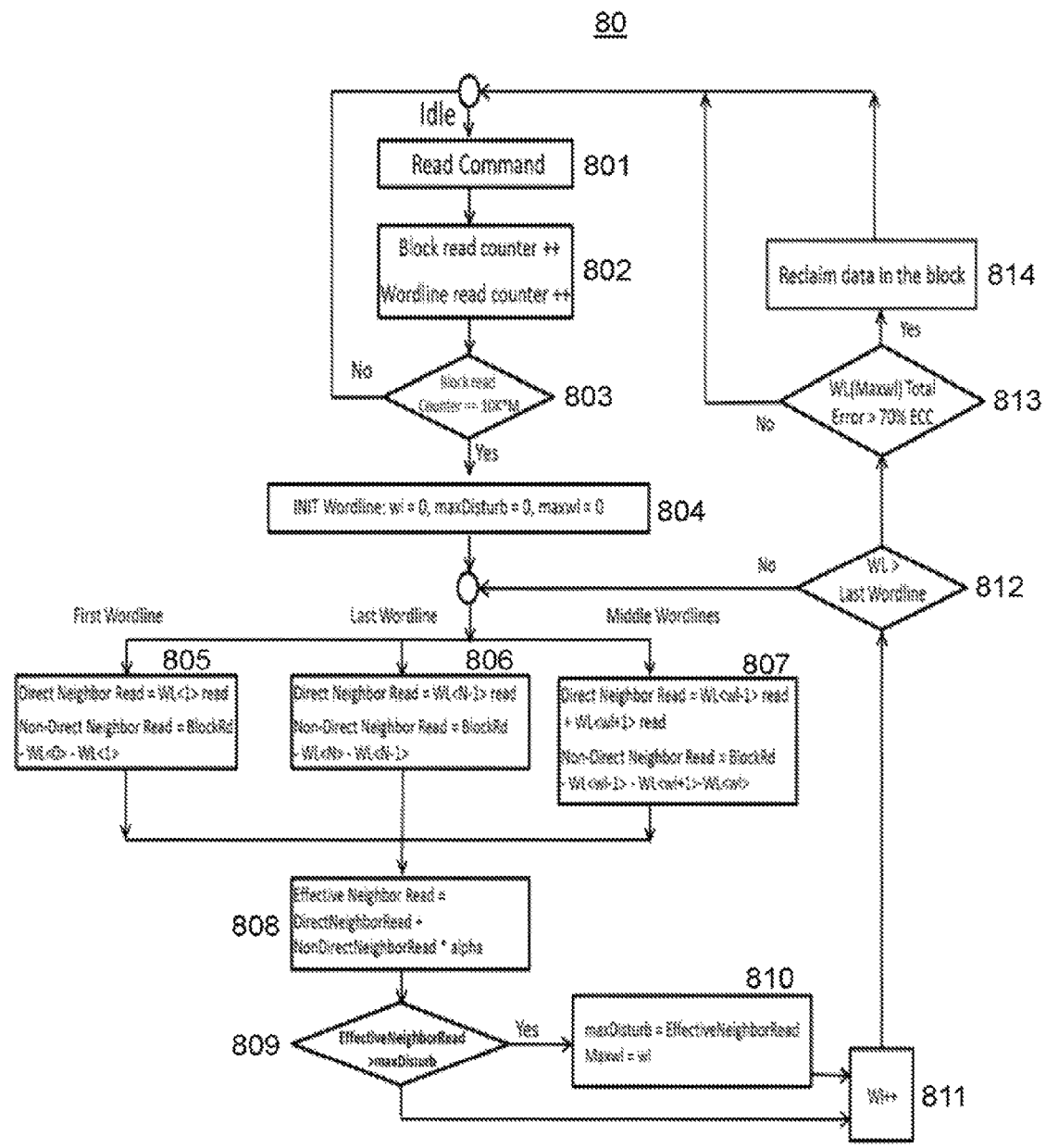
FIG. 8 is an algorithm in accordance with aspects of the invention.

FIG. 8 illustrates an algorithm 80 of example steps in an embodiment of the methods disclosed herein. An embodiment of a detailed flowchart to find the wordline that suffers the largest read disturbs for every periodic test read (i.e. 10 k reads) is illustrated.

The values of the thresholds and the predetermined count number are chosen in the algorithm 80 for illustrative purposes, and those of skill in the art will understand alternative values may be selected based on the quality of the memory device and the system requirements.

In an exemplary embodiment, pseudo code of test wordline selection policy contained in following table 1 may be used to correspond to FIG. 8.

TABLE 1

```
maxEffectiveRDisturb = 0;
wlNumMaxRd = 0;
for(wlNum=0; wlNum < N; wlNum++)
{
if(0 == wlNum) // Bottom wordline processing
    {
        effectiveRdDisturb(wlNum) = wlRd(1) + alpha*(BlockRd-wlRd(0)-wlRd(1));}
    else if(N == wlNum} // Top wordline processing
    {
        effectiveRdDisturb(wlNum) = wlRd(N-1)+alpha*(BlockRd-wlRd(N)-wlRd(N-1));}
```

TABLE 1-continued

```
    else // Middle wordlines processing
    {
        effectiveRdDisturb(wlNum)=wlRd(N-1) + wlRd(N+1) + alpha*(BlockRd-wlRd(N)-
wlRd(N-1)-wlRd(N+1));
    }
    /* Update max Effective read disturb */
    if(maxEffectiveRDisturb < effectiveRdDisturb(wlNum))
    {
        maxEffectiveRDisturb = effectiveRdDisturb(wlNum);
        wlNumMaxRd = wlNum;
}}
return wlNumMaxRd; /* Return the number of the wordline that has the largest effective read disturb
```

Above pseudo code contained in Table 1 is illustrated in the specification for exemplary purpose only. Similar code or algorithm may be implemented without departing from the inventive concept of the present invention.

Referring to FIG. 8, initially, a flash page is read (step 801), and the counters are incremented (step 802). This process is repeated until the first counter reaches the predefined count number (e.g., 10,000) (step 803). When the counters reached the predefined count number, the process categorize the wordline into three types: first wordline (step 805), last wordline (step 806) and middle wordlines (step 807). This is done to take into account end wordlines. Initial state may be defined as step (804) as described hereinafter.

For first wordline (step 805), direct neighbor read is determined by WL(1) read count, and non-direct neighbor read is determined by total block read count BlockRd subtracted by both WL(0) and WL(1) counts. For last wordline (step 807), direct neighbor read is determined by WL(n-1) read count, and non-direct neighbor read is determined by total block read count BlockRd subtracted by both WL(n) and WL(n-1) counts. For middle wordlines (step 806), direct neighbor read is determined by addition of WL(wl-1) and WL(wl+1) read counts, and non-direct neighbor read is determined by total block count BlockRd subtracted by WL(wl-1), WL(wl+1) and WL(wl).

Then, the effective neighbor read is determined by adding direct neighbor read count to non-direct neighbor read, which is multiplied by the ratio alpha (step 808). As discussed in step 702 of FIG. 7, the ratio alpha may be determined by either fixed ration solution based on flash pre-characterization or adaptive ratio learning.

In the detailed flowchart, from the point when it is determined whether the wordline is the First Wordline, Last Wordline, or Middle Wordline to the condition checking whether "WL>Last Wordline" step (step 812) is a loop to find the wordline with the largest read disturb (steps 809, 810, and 811). The firmware may need to internally process the number of direct and non-direct read disturb count maintained by read disturb count table. Initially, the wordline is assumed to be 0 and its corresponding disturb count is also initialized to 0 (step 804). As the wordline 0 up to last wordline loop are checked, for any wordline i, if its Effective Neighbor Read is larger than maxDisturb (here, maxDisturb is the maximum disturb for wordlines between 0 or i-1 and maxwl is its corresponding wordline between 0 and i-1) (step 809), then, the most disturbed wordline between 0 and i will be updated to wordline i, and also the maxDisturb is updated accordingly (step 810). If not (step 809), then there is at least one wordline between wordline 0 and wordline i-1, which has more effective read disturb than wordline i. In this case, we just keep such record of the most disturbed wordline between wordline 0 and wordline i-1 to be the recorded most disturbed wordline between wordline 0 and wordline I. The process may be iterated until the last wordline to find the most disturbed wordline (steps 811 and 812).

Lastly, it is determined whether to reclaim the data of the block based on the errors on such wordline (step 813). If the total number of errors is larger than 70% of ECC correction capability, such block may be reclaimed (step 814). If not, the process is waited until next predetermined number of reads (i.e. 10 k reads) is reached for the block and test the wordline with the largest effective read disturb again at that time. Please note that 70% ECC capability is just an exemplary embodiment and it is possible to use any other number that is determined by ECC correction capability and NAND flash characteristics.

The systems, devices, and methods disclosed herein help more accurately to predict when and whether to reclaim the data. All the exact number of errors can be configurable. Also note that the block can be at super block level, where multiple blocks can form one super block of reads (e.g. 10K reads hit to the block).

Although the foregoing embodiments have been described in some detail for purposes of clarity of understanding, the Invention is not limited to the details provided. There are many alternative ways of implementing the invention. The disclosed embodiments are illustrative and not restrictive.

What is claimed is:

1. A memory system, comprising:
   a memory including a plurality of blocks; and
   a controller configured to:
   calculate an effective read disturb based on both a direct neighbor read disturb count and a non-direct neighbor read disturb count;
   select a wordline with a largest effective read disturb for test read; and
   decide whether to reclaim data of a block based on errors on the wordline, wherein the block is one of the plurality of blocks.

2. The memory system of claim 1, further comprising an error threshold based on a difference between an error correction code (ECC) correction capability of the memory system and a total number of errors accumulated in the block.

3. The memory system of claim 1, wherein the controller is further configured to:
   calculate the non-direct neighbor read disturb count with a fixed ratio determined by a fixed ratio solution based on flash pre-characterization.

4. The memory system of claim 3, wherein the controller uses the fixed ratio of 1:2 favoring direct neighbor read disturb.

5. The memory system of claim 1, wherein the controller is further configured to:

calculate the non-direct neighbor read disturb count with an adaptive ratio determined by an adaptive ratio learning.

6. The memory system of claim 5, wherein the adaptive ratio learning is determined based on a raw error number increase per one read disturb from direct neighbor wordline and a raw error number increase per one read disturb from non-direct neighbor wordline.

7. The memory system of claim 6, wherein the raw error number increase per one read disturb from direct neighbor wordline is determined by $$X_1 = \frac{\begin{array}{c}(ERR(WL_i) - ERR(WL_j)) \times \\ (NumNonDirect(WL_i) - NumNonDirect(WL_k)) - \\ (ERR(WL_i) - ERR(WL_k)) \times \\ (NumNonDirect(WL_i) - NumNonDirect(WL_j))\end{array}}{\begin{array}{c}(NumDirect(WL_i) - NumDirect(WL_j)) * \\ (NumNonDirect(WL_i) - NumNonDirect(WL_k)) - \\ (NumDirect(WL_i) - NumDirect(WL_k)) * \\ (NumNonDirect(WL_i) - NumNonDirect(WL_j))\end{array}}$$

8. The memory system of claim 6, wherein the raw error number increase per one read disturb from non-direct neighbor wordline is determined by $$X_2 = \frac{\begin{array}{c}(ERR(WL_i) - ERR(WL_j)) \times \\ (NumDirect(WL_i) - NumDirect(WL_k)) - \\ (ERR(WL_i) - ERR(WL_k)) \times \\ (NumDirect(WL_i) - NumDirect(WL_j))\end{array}}{\begin{array}{c}(NumNonDirect(WL_i) - NumNonDirect(WL_j)) * \\ (NumDirect(WL_i) - NumDirect(WL_k)) - \\ (NumDirect(WL_i) - NumDirect(WL_j)) * \\ (NumNonDirect(WL_i) - NumNonDirect(WL_j))\end{array}}$$

9. A method, comprising:
calculating an effective read disturb metric based on both direct neighbor read disturb count and non-direct neighbor read disturb count;
selecting a wordline with a largest effective read disturb for test read; and
deciding whether to reclaim data of a block based on errors on the wordline, wherein the block is one of the plurality of blocks.

10. The method of claim 9, further comprising calculating the non-direct neighbor read disturb count with a fixed ratio determined by a fixed ratio solution based on flash pre-characterization.

11. The method of claim 10, wherein the fixed ratio is 1:2 favoring direct neighbor read disturb.

12. The method of claim 9, further comprising calculating the non-direct neighbor read disturb count with an adaptive ratio determined by an adaptive ratio learning.

13. The method of claim 12, wherein the adaptive ratio learning is determined based on a raw error number increase per one read disturb from direct neighbor wordline and a raw error number increase per one read disturb from non-direct neighbor wordline.

14. The method of claim 13, wherein the raw error number increase per one read disturb from direct neighbor wordline is determined by $$X_1 = \frac{\begin{array}{c}(ERR(WL_i) - ERR(WL_j)) \times \\ (NumNonDirect(WL_i) - NumNonDirect(WL_k)) - \\ (ERR(WL_i) - ERR(WL_k)) \times \\ (NumNonDirect(WL_i) - NumNonDirect(WL_j))\end{array}}{\begin{array}{c}(NumDirect(WL_i) - NumDirect(WL_j)) * \\ (NumNonDirect(WL_i) - NumNonDirect(WL_k)) - \\ (NumDirect(WL_i) - NumDirect(WL_k)) * \\ (NumNonDirect(WL_i) - NumNonDirect(WL_j))\end{array}}$$

15. The method of claim 13, wherein the raw error number increase per one read disturb from non-direct neighbor wordline is determined by $$X_2 = \frac{\begin{array}{c}(ERR(WL_i) - ERR(WL_j)) \times \\ (NumDirect(WL_i) - NumDirect(WL_k)) - \\ (ERR(WL_i) - ERR(WL_k)) \times \\ (NumDirect(WL_i) - NumDirect(WL_j))\end{array}}{\begin{array}{c}(NumNonDirect(WL_i) - NumNonDirect(WL_j)) * \\ (NumDirect(WL_i) - NumDirect(WL_k)) - \\ (NumDirect(WL_i) - NumDirect(WL_j)) * \\ (NumNonDirect(WL_i) - NumNonDirect(WL_j))\end{array}}$$

16. A memory device, comprising:
a memory including a plurality of blocks;
one or more counters suitable for generating direct neighbor read disturb count and non-direct neighbor read disturb count;
a control circuit configured to:
calculate an effective read disturb metric based on both of the direct neighbor read disturb count and non-direct neighbor read disturb count;
select a wordline with a largest effective read disturb for test read; and
decide whether to reclaim data of a block based on errors on the word line, wherein the block is one of the plurality of blocks.

17. The memory device of claim 16, wherein the non-direct neighbor read disturb count is calculated with a fixed ratio determined by a fixed ratio solution based on flash pre-characterization.

18. The memory device of claim 17, wherein the fixed ratio is 1:2 favoring direct neighbor read disturb.

19. The memory device of claim 16, wherein the non-direct neighbor read disturb count is calculated with an adaptive ratio determined by an adaptive ratio learning.

20. The memory device of claim 19, wherein the adaptive ratio learning is determined based on a raw error number increase per one read disturb from direct neighbor wordline and a raw error number increase per one read disturb from non-direct neighbor wordline.

* * * * *